US008232173B2

(12) United States Patent
Ding et al.

(10) Patent No.: US 8,232,173 B2
(45) Date of Patent: Jul. 31, 2012

(54) STRUCTURE AND DESIGN STRUCTURE FOR HIGH-Q VALUE INDUCTOR AND METHOD OF MANUFACTURING THE SAME

(75) Inventors: Hanyi Ding, Essex Junction, VT (US); Mete Erturk, Alburg, VT (US); Robert A. Groves, Highland, NY (US); Zhong-Xiang He, Essex Junction, VT (US); Peter J. Lindgren, Essex Junction, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 12/917,029

(22) Filed: Nov. 1, 2010

(65) Prior Publication Data

US 2012/0104546 A1 May 3, 2012

(51) Int. Cl.
*H01L 21/20* (2006.01)

(52) U.S. Cl. ................................ 438/381; 257/E21.022

(58) Field of Classification Search .................. 438/381; 257/E21.022

See application file for complete search history.

(56) References Cited

U.S. PATENT DOCUMENTS

| | | | | |
|---|---|---|---|---|
| 6,646,534 | B2 | 11/2003 | Ahn et al. | |
| 6,701,607 | B2 | 3/2004 | Ahn et al. | |
| 6,760,967 | B2 | 7/2004 | Ahn et al. | |
| 6,767,826 | B2 * | 7/2004 | Abe | 438/638 |
| 6,779,250 | B2 | 8/2004 | Ahn et al. | |
| 6,817,087 | B2 | 11/2004 | Ahn et al. | |
| 6,822,545 | B2 | 11/2004 | Ahn et al. | |
| 6,825,747 | B2 | 11/2004 | Ahn et al. | |
| 6,850,141 | B2 | 2/2005 | Ahn et al. | |
| 6,853,288 | B2 | 2/2005 | Ahn et al. | |
| 6,900,716 | B2 | 5/2005 | Ahn et al. | |
| 6,910,260 | B2 | 6/2005 | Ahn et al. | |
| 6,927,666 | B2 | 8/2005 | Ahn et al. | |
| 6,946,389 | B2 | 9/2005 | Farrar et al. | |
| 6,948,230 | B2 | 9/2005 | Ahn et al. | |
| 7,112,504 | B2 * | 9/2006 | Hsin et al. | 438/386 |
| 7,158,004 | B2 | 1/2007 | Ahn et al. | |
| 7,164,188 | B2 | 1/2007 | Farrar et al. | |
| 7,626,257 | B2 * | 12/2009 | Knorr | 257/698 |
| 2004/0087098 | A1 * | 5/2004 | Ng et al. | 438/381 |
| 2006/0131691 | A1 * | 6/2006 | Roozeboom et al. | 257/534 |
| 2008/0280435 | A1 * | 11/2008 | Klootwijk et al. | 438/667 |
| 2008/0290524 | A1 * | 11/2008 | Lanzerotti et al. | 257/770 |
| 2009/0283854 | A1 | 11/2009 | Levy et al. | |
| 2010/0044853 | A1 * | 2/2010 | Dekker et al. | 257/692 |
| 2010/0136783 | A1 * | 6/2010 | Lee et al. | 438/667 |

FOREIGN PATENT DOCUMENTS

| | | |
|---|---|---|
| JP | 63048809 | 3/1988 |
| KR | 2090643 | 5/2001 |
| KR | 3055485 | 12/2001 |

* cited by examiner

*Primary Examiner* — Alexander G. Ghyka
*Assistant Examiner* — Stanetta Isaac
(74) *Attorney, Agent, or Firm* — Anthony Canale; Roberts Mlotkowski Safran & Cole, P.C.

(57) ABSTRACT

Structures with high-Q value inductors, design structure for high-Q value inductors and methods of fabricating such structures is disclosed herein. A method in a computer-aided design system for generating a functional design model of an inductor is also provided. The method includes: generating a functional representation of a plurality of vertical openings simultaneously formed in a substrate, wherein a first of the plurality of vertical openings is used as through silicon vias and is etched deeper than a second of the plurality of vertical openings used for high-Q inductors; generating a functional representation of a dielectric layer formed in the plurality of vertical openings; and generating a functional representation of a metal layer deposited on the dielectric layer in the plurality of vertical.

10 Claims, 6 Drawing Sheets

16a

24

STRUCTURE AND DESIGN STRUCTURE FOR HIGH-Q VALUE INDUCTOR AND METHOD OF MANUFACTURING THE SAME

FIELD OF THE INVENTION

The invention relates to integrated circuits, and more particularly, to structures with high-Q value inductors, design structure for high-Q value inductors and methods of fabricating such structures.

BACKGROUND

An inductor is a passive electrical component that is used in integrated circuits for many different types of applications. These applications can include, for example, communication systems, radar systems, television systems, highpass filters and tank circuits. Inductors can be miniaturized for use in compact communication systems, such as cell phones and modems, by fabricating spiral inductors on the same substrate as the integrated circuit to which they are coupled using integrated circuit manufacturing techniques. However, spiral inductors are difficult to manufacture and add significant expense to the fabrication process. This is due to the many different manufacturing steps required to build the inductor.

Traditionally, fabricating high-Q value inductor remains an expensive process and a significant challenge to many integrated circuit (IC) manufacturers. For example, to fabricate a high-Q inductor, it is currently necessary to have a thick metal wiring level such as Cu or Al and its associated via levels dedicated specifically for high-Q inductor formation. To further enhance the quality factor of inductors, sometimes two thick metal wires are dedicated to such inductor formation. Therefore, there remains a need for high quality factor inductor formation with an inexpensive method.

Accordingly, there exists a need in the art to overcome the deficiencies and limitations described hereinabove.

SUMMARY

In a first aspect of the invention, a method in a computer-aided design system for generating a functional design model of an inductor is provided. The method comprises: generating a functional representation of a plurality of vertical openings simultaneously formed in a substrate, wherein a first of the plurality of vertical openings is used as through silicon vias and is etched deeper than a second of the plurality of vertical openings used for high-Q inductors; generating a functional representation of a dielectric layer formed in the plurality of vertical openings; and generating a functional representation of a metal layer deposited on the dielectric layer in the plurality of vertical openings.

In a second aspect of the invention, a design structure is embodied in a machine readable medium for designing, manufacturing, or testing an integrated circuit. The design structure comprises: a first set of openings in a substrate; a second set of vertical openings in a spiral shape in the substrate, the second set of openings being shallower and narrower than the first second of openings; dielectric liner lining the first and second set of openings; a metal layer in the first and second set of openings with the metal layer in the first openings being exposed on a backside of the substrate; and a metal material on the backside of the substrate in contact with the metal layer exposed in the first openings.

In a third aspect of the invention, a structure comprises: a first set of vertical openings in a substrate; a second set of vertical openings in a spiral shape in the substrate, the second set of openings being shallower and narrower than the first second of openings; dielectric liner lining the first and second set of vertical openings; a metal layer in the first and second set of openings with the metal layer in the first set of vertical openings being exposed on a backside of the substrate; and a metal material on the backside of the substrate in contact with the metal layer exposed in the first set of vertical openings.

In another aspect of the invention, a method of manufacturing a high Q-inductor, comprises simultaneously forming a plurality of vertical openings in a substrate. The first of the plurality of vertical openings is used as through silicon vias and is etched deeper than a second of the plurality of vertical openings used for high-Q inductors. The method further comprises depositing a dielectric layer in the plurality of vertical openings and depositing a metal layer on the dielectric layer in the plurality of vertical openings. The backside of the substrate is planarized to expose the metal layer in the first of the plurality of vertical openings.

In another aspect of the invention, a method comprises forming a first set of openings in a substrate and forming simultaneously with the first set of openings, a second set of openings in the substrate. The second set of openings is shallower than the first second of openings. The method further comprises filling the first and second set of openings with a dielectric liner and filling the first and second set of openings with a metal layer. The backside of the substrate is planarized to expose only the metal layer in the first set of openings. A metal material is deposited on the planarized backside of the substrate in contact with the metal layer.

In another aspect of the invention, a method of fabricating high-Q inductors, comprise: forming a first set of openings in a substrate about a gate structure and at a first depth; forming a second set of openings in the substrate at a second depth shallower than the first depth, the first and second set of openings being formed in a same etching process; lining the first and second set of openings with an insulator; filling the first and second set of openings with a metal material; planarizing a backside of the substrate to expose only the metal material in the first set of openings; and depositing a metal material on the planarized backside of the substrate.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits, and more particularly, to structures with high-Q value inductors, a design structure for high-Q value inductors and methods of fabricating such structures. In embodiments, the present invention utilizes through-silicon via processing in the manufacturing of the high-Q value inductor. This significantly reduces the costs associated with fabricating the high-Q value inductor, in that it can now be integrated with other processes. In fact, advantageously, implementing the processing of the present invention basically provides a way in which to form a high-Q value inductor at low or no additional cost in chips already using through wafer vias, such as SiGe power amplifiers or RF CMOS rf switches. The inventive structure and design structure is well suited for RF applications such as TV tuner circuits.

Figure 1:
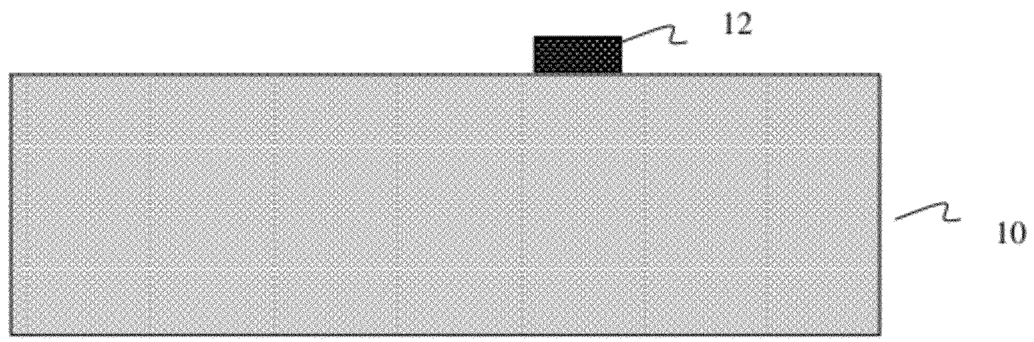
FIGS. 1-8 show structures and respective processing steps in accordance with aspects of the invention.

FIG. 1 shows a beginning structure and respective processing steps in accordance with aspects of the invention. More specifically, FIG. 1 shows a beginning structure having a conventional gate structure 12 fabricated on a substrate 10. The substrate 10 can be, for example, Si or SOI. In embodiments, the substrate can be a high resistively substrate such as, for example, a substrate with a resistivity on the order of about 1000 Ω-cm. In alternative embodiments, a lower epitaxial layer with high resistivity (e.g., about 10 Ω-cm) can be grown on SOT.

The gate structure 12 is a conventional gate structure including, for example, a poly body patterned on an oxide layer, with nitride sidewalls and cap layer. Source and drain regions are formed using conventional ion implantation processes. As the gate structure is a conventional structure, no further explanation is required herein. In a non-limiting example, the gate structure 12 can be used in a NPN/FET device, for example.

Figure 2:
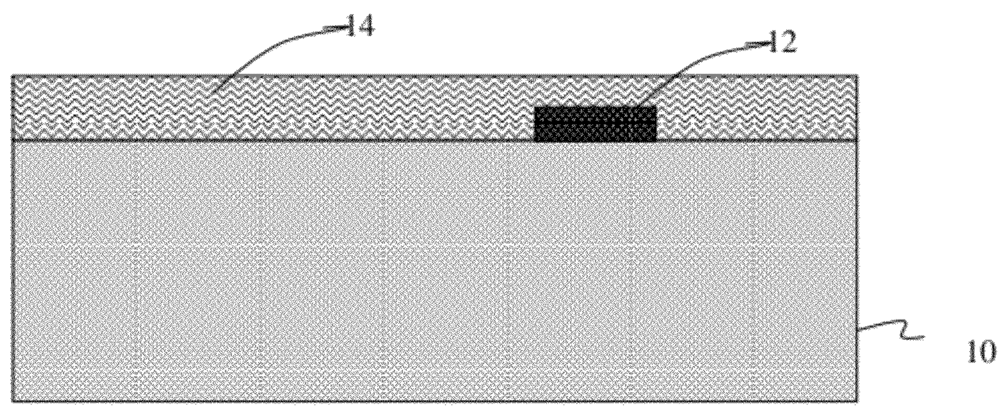

In FIG. 2, an isolation layer 14 is deposited on the structure of FIG. 1. In embodiments, the isolation layer 14 can be, for example, a BPSG layer. The isolation layer 14 will be used in subsequent processing steps to form the through vias and trenches for the high-Q inductors.

Figure 3:
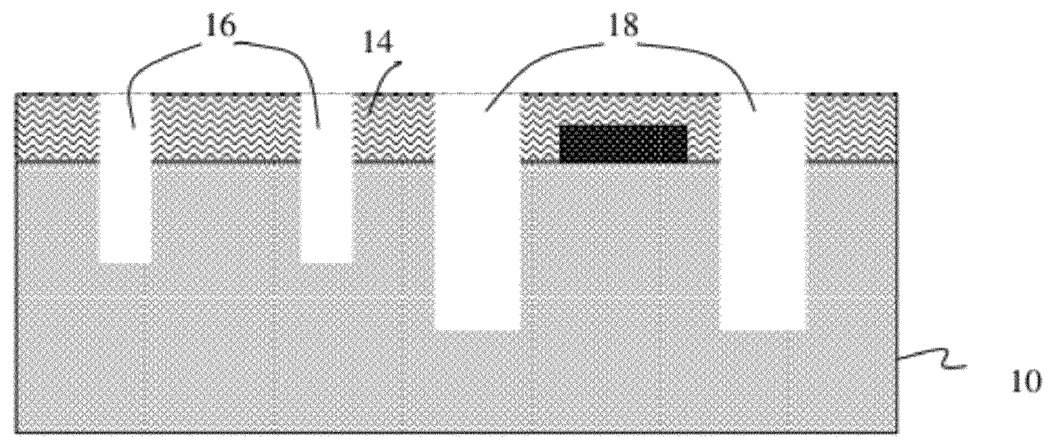

In FIG. 3, the structure of FIG. 2 is patterned using conventional lithographic and etching processes known to those of skill in the art. For example, a mask (not shown) is deposited on the isolation layer 14 and exposed to light to form patterns or openings. The structure is then subject to an etching process such as, for example, a deep silicon etch using reactive ion etching (RIE) to form openings 16 and 18. The openings 18 are through silicon vias; whereas, the openings 16 are fabricated to form the high-Q inductors. As shown with reference to FIG. 9, the openings 16 may be in the shape of a spiral to form spiral inductors.

In embodiments, the openings 18 are about 25% larger (wider) than the openings 16 (due to the corresponding sizes of the openings formed in the mask). More specifically, the width of the openings 16 (e.g., inductor) is, e.g., about 20% or more, smaller than the through silicon via openings 18. The smaller opening 16 slows down the deep silicon etch rate by, e.g., 40% or more. In embodiments, the openings 18 is about 150 microns in depth and the openings 16 can range about 75% to 60% of the depth of the openings 18. The shallower depth of the openings 16 avoids shorting of the inductor bottom when the wafer backside is grinded to expose the through silicon vias (e.g., openings 18 with metal deposited therein).

Figure 4:
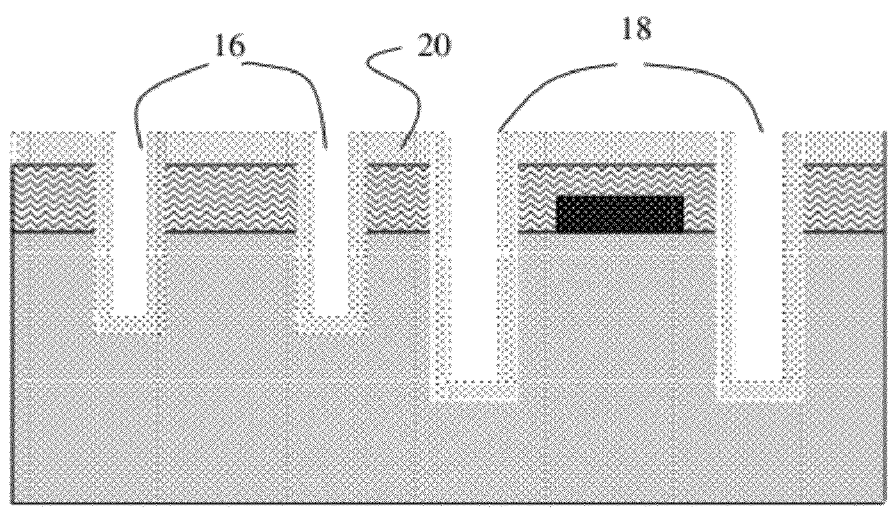

In FIG. 4, a dielectric film 20 is deposited on the structure of FIG. 3. More specifically, a dielectric film 20 such as, for example, $SiO_2$, is deposited in the openings 16 and 18 and surface of the resist 14. The deposition process can be, for example, a low-pressure chemical vapor deposition (CVD) process. In alternative processes, an oxidation process can be used to form a thin oxide layer. The dielectric film 20 is provided as an isolation structure and can be about less than 3000 Å in thickness. The thickness of the dielectric film 20 can vary but should not completely fill any of the openings 16, 18.

Figure 5:
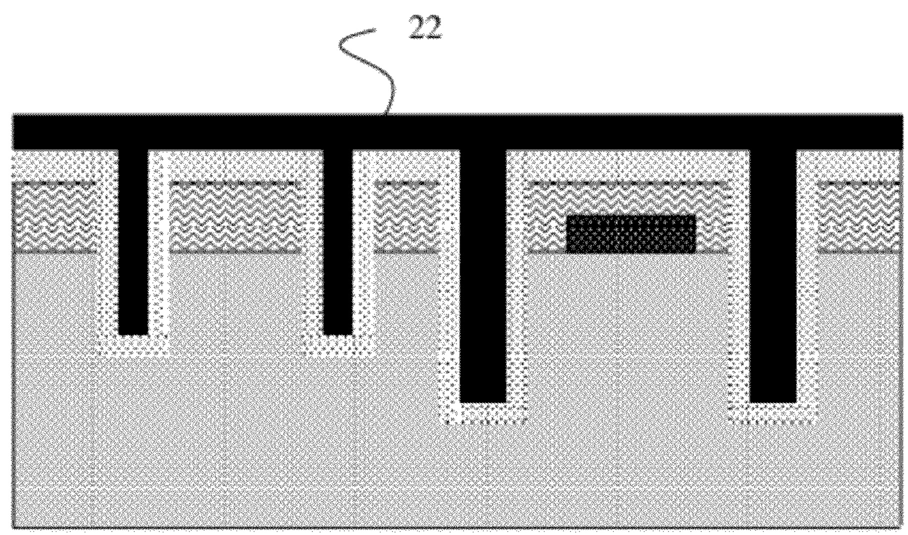

In FIG. 5, a metal layer 22 is deposited over the dielectric film 20. In embodiments, the metal layer 22 can include, for example, a TiN liner. The metal is preferably tungsten or copper, but may be any conductive material or alloy. In embodiments, the metal layer 22 completely fills the openings 16, 18. The metal layer 22 will form the through silicon interconnects, as well as the high-Q inductors.

Figure 6:
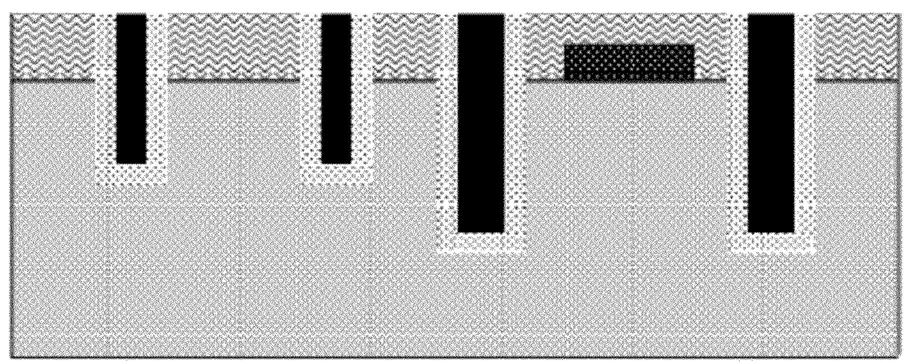

In FIG. 6, the metal layer 22 and dielectric film 20 are subject to a polishing process to planarize the structure. In embodiments, the polishing process is a chemical mechanical polishing (CMP) which completely removes the metal layer 22 and dielectric film 20 from a surface of the structure. In embodiments, the metal layer 22 and dielectric film 20 remain within the openings 16, 18.

Figure 7:
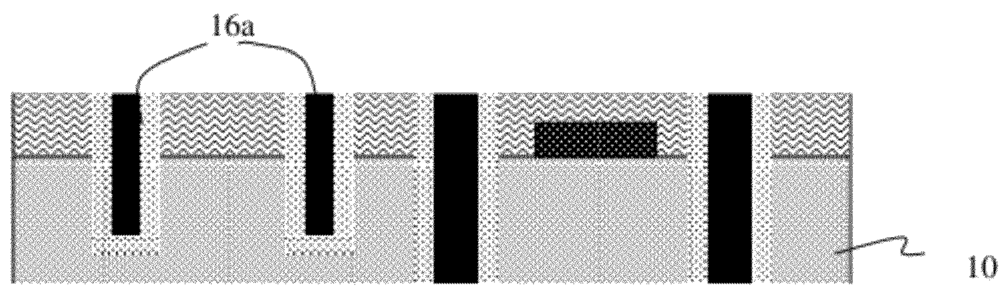

In FIG. 7, the backside of the structure is subject to a CMP process in order to thin the substrate 10. In embodiments, the CMP process exposes the metal layer 22 in the openings 18 (e.g., forming the through silicon vias); whereas, the metal is not exposed in the openings 16 thereby forming high-Q inductors **16*a*. Also, there will be no shorting of the high-Q inductors 16*a* as the substrate 10 is thinned to only expose the metal layer in the openings 18**. In embodiments, the thickness of silicon through-via can range from 50 to 300 um, which is ideal for low resistance inductor formation. Also, in this way it is now possible to form spiral inductors formed vertically in silicon substrate using a through wafer via process.

Figure 8:
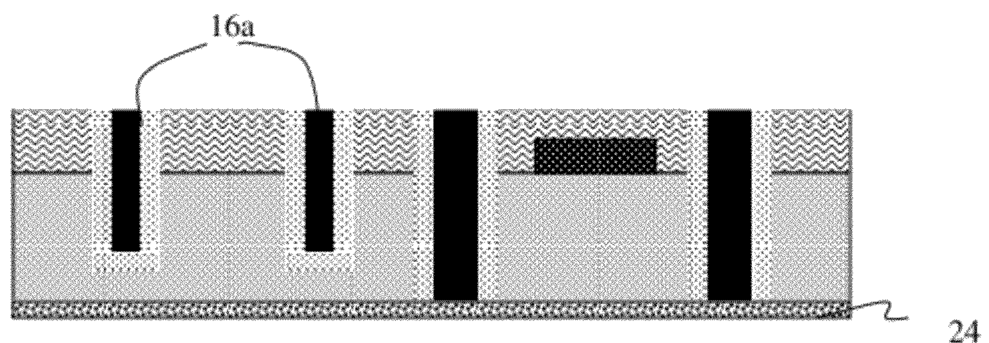

In FIG. 8, the backside of the structure is subject to a metallization process. More specifically, a thin metal layer 24 is deposited on the backside of the structure. The metal layer 24 is provided to prevent oxidation. The metal layer 24 may be, for example, an alloy, gold, copper, nickel, etc. and can vary in thickness. In embodiments, the thickness can range from about 1 to 10 microns, as one non-limiting example. The use of solenoids becomes possible if the backside metal is patterned.

Figure 9:
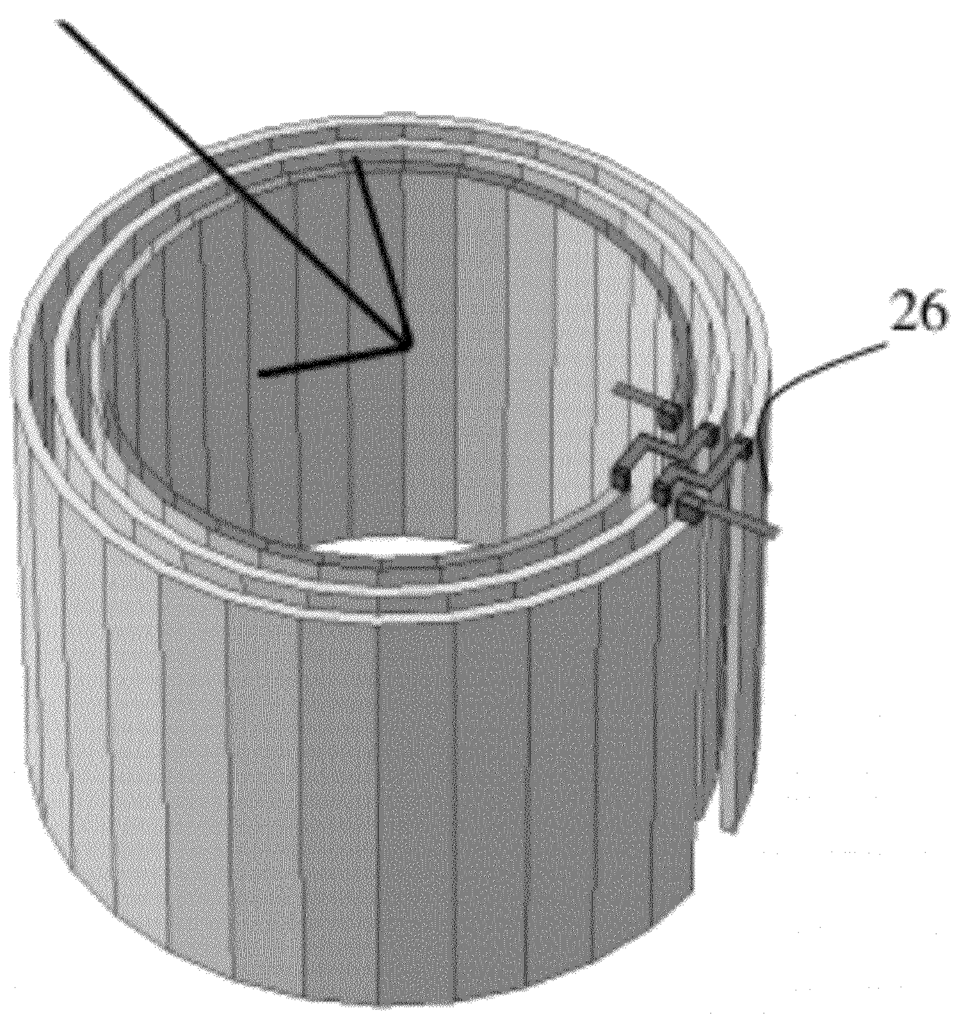
FIG. 9 shows a partial view of a final structure in accordance with aspects of the invention.

FIG. 9 shows a partial view of a final structure in accordance with aspects of the invention. As shown in FIG. 9, the high-Q inductors **16*a* are formed in a spiral shape. More specifically, the high-Q inductors 16*a* are cut so that they are not continuous circles (e.g., c-shapes with a very small cut) that can then be formed into a very high aspect ratio spiral. The high-Q inductors 16*a* include a high level metal 26 such as, for example, using BEOL processes for metal wiring connections. The high level metal 26** can be formed in conventional process known to those of skill in the art.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

Figure 10:
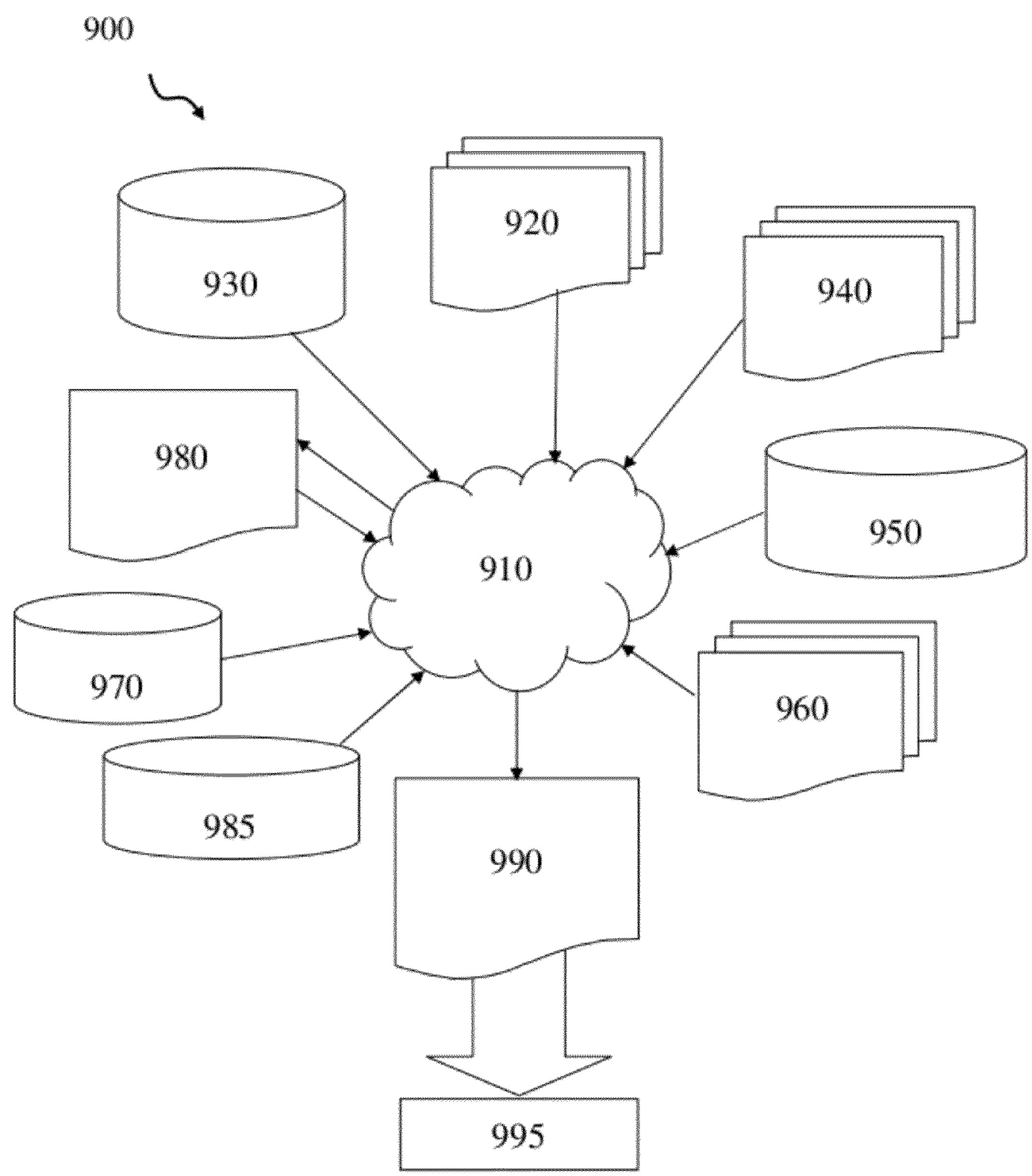
FIG. 10 is a flow diagram of a design process used in semiconductor design, manufacture, and/or test.

FIG. 10 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 990 may comprise a compiled, executable HDL simulation model that functionally simulates the devices shown in FIGS. 1-9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of manufacturing a high-Q inductor, comprising:

simultaneously forming a plurality of vertical openings in a substrate, wherein a first of the plurality of vertical openings is used as through silicon vias and is etched deeper than a second of the plurality of vertical openings used for high-Q inductors;

depositing a dielectric layer in the plurality of vertical openings;

depositing a metal layer on the dielectric layer in the plurality of vertical openings; and planarizing a backside of the substrate to expose the metal layer in the first of the plurality of vertical openings.

2. The method of claim 1, wherein the planarizing the backside of the substrate results in a thickness of about 50 to 300 um.

3. The method of claim 1, wherein the substrate has a resistivity on an order of about 1000 Ω-cm.

4. The method of claim 1, further comprising forming a lower epitaxial layer on the substrate with resistivity on an order of about 10 Ω-cm.

5. The method of claim 1, wherein the second of the plurality of vertical openings is about 20% or more smaller in width than the first of the plurality of openings and the smaller opening slows down a deep silicon etch rate of the second of the plurality of vertical openings.

6. The method of claim 1, wherein the second of the plurality of vertical openings are spiral in shape.

7. The method of claim 1, wherein the forming the first of the plurality of vertical openings and the second of the plurality of vertical openings includes patterning a resist having a first width for the first of the plurality of vertical openings and a second width for the second of the plurality of vertical openings.

8. The method of claim 7, wherein the first width is larger than the second width.

9. The method of claim 8, wherein the first width is about 25% larger than the second width.

10. The method of claim 1, wherein an etching rate is slower in the second of the plurality of vertical openings than the first of the plurality of vertical openings.

* * * * *